US008503221B1

(12) United States Patent
Hobson et al.

(10) Patent No.: US 8,503,221 B1
(45) Date of Patent: Aug. 6, 2013

(54) SRAM CELL WITH COMMON BIT LINE AND SOURCE LINE STANDBY VOLTAGE

(76) Inventors: Richard Frederic Hobson, Coquitlam (CA); Hooman Jarollahi, North Vancouver (CA)

(*) Notice: Subject to any disclaimer, the term of this patent is extended or adjusted under 35 U.S.C. 154(b) by 278 days.

(21) Appl. No.: 13/152,243

(22) Filed: Jun. 2, 2011

(51) Int. Cl.
G11C 11/00 (2006.01)
(52) U.S. Cl.
USPC .......................................................... 365/154
(58) Field of Classification Search
USPC .......................................................... 365/154
See application file for complete search history.

(56) References Cited

U.S. PATENT DOCUMENTS

| | | | |
|---|---|---|---|
| 4,750,155 A | 6/1988 | Hsieh | |
| 5,453,950 A | 9/1995 | Voss | |
| 6,044,010 A | 3/2000 | Deschene | |
| 6,191,883 B1 | 2/2001 | Huffman | |
| 6,205,049 B1 | 3/2001 | Lien | |
| 6,940,746 B2 * | 9/2005 | Kushida | 365/154 |
| 7,164,596 B1 * | 1/2007 | Deng et al. | 365/154 |
| 7,307,873 B2 | 12/2007 | Barbier | |
| 7,372,721 B2 | 5/2008 | Sachdev | |
| 7,684,262 B2 | 3/2010 | Zampaglione | |
| 7,706,174 B2 | 4/2010 | Pradhan | |
| 7,852,113 B2 * | 12/2010 | Terzioglu et al. | 326/33 |
| 8,085,579 B2 * | 12/2011 | Inoue | 365/154 |

OTHER PUBLICATIONS

Hiep Tran, Demonstration of 5T SRAM and 6T Dual-Port RAM Cell Arrays, Digest of Papers, Symposium on VLSI Circuits, 1996, pp. 68-69. Please see FIGS 1-3 and related discussion.

R.W.Mann et al, Ultralow-Power SRAM Technology, IBM J. Res. and Dev., Vol. 47, No. 5/6 Sep./Nov. 2003, pp. 553-566. Please see section: Vt and subthreshold leakage.
Ingvar Carlson, et al, A High Density, Low Leakage, 5T SRAM for Embedded Caches; Proceedings 30th European Solid-State Circuits Conference, ESSCIRC 2004, pp. 215-218.
Muhammad Khellah, et al, A 256-Kb Dual-Vcc SRAM Building Block in 65-nm CMOS Process with Actively Clamped Sleep Transistor, IEEE J. Solid-State Circuits, vol. 42, No. 1, Jan. 2007, pp. 233-242. Please see sections I to IV.
R.F. Hobson, A 5T SRAM Cell with 4 Power Terminals for Read/Write/Standby Assist, Proc. Intl. Conf. on Computer Design, CDES 2009, Jul. 2009, pp. 10-16. Please see FIGS. 5, 6, 10, and related discussion.
Hooman Jarollahi, et al, Dynamic Power Reduction in a Novel CMOS 5T-SRAM for Low-Power SoC, Proc. Intl. Conf. on Computer Design, CDES 2010, Jul. 12-15, pp. 169-175. (This work was first presented by HJ on Jun. 3, 2010 as part of his M.A.Sc. Thesis defense).
Hooman Jarollahi, et al, Power and Area Efficient 5T-SRAM with Improved Performance for Low-Power SoC in 65nm CMOS, Proc. Midwest Symposium on Circuits and Systems, MWSCAS 2010, Aug. 1-4, pp. 121-123. (This work was first presented by HJ on Jun. 3, 2010 as part of his M.A.Sc. Thesis defense).

* cited by examiner

*Primary Examiner* — Vanthu Nguyen

(57) ABSTRACT

A high threshold five transistor SRAM bit cell with cross-coupled inverters has a single BIT line, a common logic 1 supply voltage, and two logic 0 virtual ground source voltages. The BIT line is coupled to the bit cell by a pass transistor. When BIT line and virtual ground lines are not otherwise being used, they are connected to a common standby voltage that substantially lowers bit cell standby leakage. Writing is performed by driving a data signal through the pass transistor and is facilitated by creating a voltage differential on the virtual ground lines. Reading is also performed through the pass transistor wherein the BIT line is initially at the standby voltage, and is then driven lower or higher depending upon the data value stored in the bit cell.

9 Claims, 6 Drawing Sheets

SRAM CELL WITH COMMON BIT LINE AND SOURCE LINE STANDBY VOLTAGE

FIELD OF THE INVENTION

This invention relates to a five transistor static random access memory cell, particularly when the standby power of the memory cell and its associated bit line are to be reduced.

BACKGROUND OF THE INVENTION

FIGS. 1 and 2 schematically depict a typical prior art single binary digit (i.e. 1-bit) six-transistor (6 T) SRAM bit cell incorporating cross-coupled inverters 1, 2. Inverter 1 is formed by PMOS "pull-up" transistor P1 and NMOS "pull-down" transistor N1, as shown in FIG. 2. PMOS transistor 1's source is connected to a logic 1 voltage reference (Vd1==Vdd), PMOS transistor 1's drain is connected in series with NMOS transistor 1's drain, NMOS transistor 1's source is connected to a logic 0 voltage reference (Vg1==system ground, Gnd), and PMOS transistor 1's gate is connected to NMOS transistor 1's gate. Inverter 2 is formed by PMOS pull-up transistor P2 and NMOS pull-down transistor N2. PMOS transistor P2's source is connected to Vd2 (==Vdd), PMOS transistor P2's drain is connected in series with NMOS transistor N2's drain, NMOS transistor N2's source is connected to Vg2 (==Gnd), and PMOS transistor P2's gate is connected to NMOS transistor N2's gate. Inverters 1, 2 are cross-coupled by connecting the gates of PMOS transistor P1 and NMOS transistor N1 to the drains of PMOS transistor P2 and NMOS transistor N2 to define a first storage node Q; and, by connecting the gates of PMOS transistor 2 and NMOS transistor 2 to the drains of PMOS transistor 1 and NMOS transistor 1 to define a second storage node Q̄. The source-to-drain path of NMOS pass transistor N3 is connected between first storage node Q and first bit line, BIT, and the gate of NMOS transistor N3 is connected to read-write word line RW. The source-to-drain path of NMOS pass transistor N4 is connected between second storage node Q̄ and second bit line, $\overline{BIT}$, and the gate of NMOS transistor N4 is connected to word line RW.

Pass transistors N3, N4 are selectively turned on from a decoder (not shown) via word line RW to read or write data from/to the bit cell via bit lines BIT, $\overline{BIT}$. The cross-coupled structure of inverters 1, 2 ensures that logically opposite voltages are maintained at first and second storage nodes Q, Q̄ respectively. The properties (e.g. Width, Length, and threshold $V_t$) of transistors P1, P2, and N1 through N4 are selected to accommodate conflicting circuit requirements for reading and writing. Large numbers of such bit cells are combined to form memory arrays, therefore any reduction in size is of considerable commercial interest.

FIG. 3 schematically depicts another prior art SRAM bit cell incorporating cross-coupled inverters. The FIG. 3 bit cell is schematically similar to the FIG. 1 bit cell, except that NMOS pass transistor N4 and associated $\overline{BIT}$ line have been removed.

In the FIG. 3 embodiment, data are written into the bit cell by applying a logic high voltage signal, Vdd, to the read-write word line RW, thereby turning NMOS transistor N3 on coupling node Q to the BIT line which must also be driven to the correct datum logic voltage value. A datum is read from the bit cell by first setting the BIT line to an intermediate (pre-charge) voltage, usually above or close to Vdd/2. Then, by applying a logic high voltage signal, Vdd, to word line RW, internal node Q is connected to the BIT line through transistor N3. If Q is initially high (storing a logic 1), the BIT line is pulled weakly higher by P2 whereas if Q is initially low (storing a logic 0), the BIT line is pulled lower by N2. A sensing circuit, not shown, is used to determine when the BIT line is being pulled high and when it is being pulled low.

The writing of a logic 0 value from BIT through NMOS transistor N3 into the FIG. 3 bit cell is a relatively "strong" event, in that NMOS transistor N3 inherently pulls down to ground, so if a logic 1 value is already stored at node Q, that value is easily overwritten by the logic 0 value. However, the writing of a logic 1 value through NMOS transistor N3 into the FIG. 3 bit cell is a relatively "weak" event, in that if a logic 0 value is already stored at node Q, NMOS transistor N3 tends to shut off before the stored logic 0 value is fully overwritten by the applied logic 1 value. Consequently, the operation of writing a logic 1 value into the FIG. 3 bit cell may fail or require an unacceptably long period of time. One way to compensate for this is to preferentially adjust the sizes (and possibly thresholds) of the transistors in inverters 1, 2, as well as transistor N3, so that a "weak" logic 1 value driven onto inverter 1's node Q, more easily cross-couples through node Q and inverter 2 to complete the writing event at node Q. While this technique can be made to work, as taught by Carlson et al (European Solid-State Circuits Conference, ESSCIRC, 2004, pp 215-218), the drawback is that larger transistors consume additional integrated circuit silicon area and power. Since the primary advantage of the 5 T cell over the 6 T cell is a reduction in silicon area, the full advantage of a 5 T cell is not realized with this technique.

FIG. 4 depicts another 5 T bit cell, as taught by Tran (Symposium on VLSI Circuits, 1996, pp 68-69). In this invention, transistor Nb is inserted between bit cell node Vg2 and system ground to facilitate a write 1 operation. Many bit cells in a column are usually connected to transistor Nb in the preferred embodiment, although only one of them has its RW line activated (selected) at a time. Capacitor, Cg2, is chosen to limit the voltage increase on Vg2, which rises during a write 1 operation. Prior to any read or write, node WriteZ is high, thereby maintaining node Vg2 at Gnd as its standby state. At the beginning of a write, node WriteZ is driven to Gnd shutting off transistor Nb, so that node Vg2's voltage is held by capacitor Cg2. During a write 1, when storage node Q must be forced from logic 0 to logic 1, floating node Vg2 is pulled up via transistors N2 and N3 so that the voltage on storage node Q can more easily exceed the trip voltage of the bit cell's first inverter, to help change the storage state of Q from 0 to 1. This write-assist technique eases the burden of designing a 5 T cell that reads and writes with more equal facility, although the low standby power objective is not met. Care must be taken to limit the rise of Vg2 as other cells in the same column, which are not being accessed, are write-disturbed by the rise of Vg2 which connects to a whole column (or sub-column). Another write-assist approach is set out in U.S. Pat. No. 6,044,010, where node Vg2 of FIG. 4 is driven across multiple columns of bit cells, in the same direction as the word line, RW. This approach requires 2 steps to write data, a pre-write step and a write step. It also fails to meet the low standby power objective.

Another write-assist method is to reduce the logic 1 voltage value (Vdd or Vd1, Vd2 in FIGS. 1-4) during a write operation as taught in U.S. Pat. No. 6,205,049. Furthermore, individual voltages to inverters 1,2 in FIGS. 1-3 can be varied as taught by Kushida (U.S. Pat. No. 6,940,746) and Hobson (Proc. 2009 Conf. on Computer Design, pp 10-16). The latter reference combines a reduction in Vd1, Vd2 and an increase in Vg1, Vg2 to both lower standby leakage power and provide a write 1 assist for 5 T bit cells, as shown in FIG. 5. A disadvantage of the control circuitry in FIG. 5 is that the number of transistors used to control Vd1, Vd2 and Vg1, Vg2 is significant, thereby reducing the potential area savings of a 5 T bit cell. A further disadvantage of FIG. 5, is that transistor, e, used for "equalizing" Vg1, and Vg2 during a write operation, slows the write operation by passing charge from Vg2 onto Vg1.

When a memory requires a large number of bit cells, the standby leakage power of said cells may become excessive, especially for battery operated applications. One method to reduce the leakage power of a bit cell, as taught by Mann et al. (IBM J. Res. And Dev. Vol. 47, No. 5/6, September/November 2003, pp 553-566), is to use transistors P1, P2, N1 to N4 (in either a 5 T or a 6 T bit cell) which have higher turn-on thresholds, $V_t$. This is because off-state channel leakage current is exponentially related to threshold voltage. Higher pass transistor thresholds worsen the write 1 problem because, for example, pass transistor N3 shuts off earlier when its threshold is increased, thereby having even less pull-up capability at storage node Q. This drawback can be reduced by driving word line RW slightly above the bit cell Vdd voltage, as taught by Huffman et al in U.S. Pat. No. 6,191,883.

Standby power can also be reduced if the voltage across bit cells is reduced. This may be accomplished either by reducing the logic 1 voltage value (Vd1, Vd2, FIGS. 1, 2), or increasing the logic 0 voltage value (Vg1, Vg2, FIGS. 1, 2), or simultaneously lowering Vd and increasing Vg, as taught by Khellah et al (IEEE JSSC, Vol. 42, No. 1, January 2007, pp 233-242). An embodiment of this is also shown in FIG. 5 (Proc. 2009 Conf. on Computer Design, pp 10-16). Another embodiment of this technique is taught in U.S. Pat. No. 7,372,721, where voltages Vh and Vl are used to retain 6 T bit cell state, Vh (Vh<Vdd) being used for logic 1 and Vl (Vl>Gnd) being used for logic 0. A drawback of the latter teaching is that noise margin during a read operation, especially at higher temperatures, could be significantly reduced. It is further affected by manufacturing process parameter variations which can cause unwanted asymmetry in a 6 T bit cell.

Prior to a 5 T bit cell read operation, the BIT line should be pre-charged or set to a safe voltage that minimizes the loss of noise margin due to connecting node Q (FIG. 3) to the BIT line. Prior art designs generally pre-charge BIT lines to Vdd/2 or higher voltages. According to simulations, the voltage which maximizes Read-Noise-Margin (RNM) for the fast-NMOS, slow-PMOS (FS) process corner is the best one to use for all process corners (Jarollahi et al, Proc. Midwest Symposium on Circuits and Systems, MWSCAS 2010, pp 121-123). This voltage may be less than Vdd/2. If a separate time slot or cycle is required for a pre-charge operation, as in Carlson et al (European Solid-State Circuits Conference, ESSCIRC, 2004, pp 215-218), this time may not be fully recoverable by overlapping with other operations, such as decoding. It is thus desirable to be able to "park" BIT lines at a standby voltage that not only maximizes RNM, but may also be used for a bit cell standby power reducing voltage, Vsb.

The present invention addresses 5 T bit cell prior art drawbacks related to maintaining BIT line voltage while simultaneously reducing bit cell standby power and providing write 1 support.

SUMMARY OF INVENTION

The invention permits maximal area savings in a 5 T SRAM bit cell while using high threshold transistors and a raised source virtual ground voltage for reduction of standby leakage power. During memory block standby, bit cell virtual ground lines and BIT lines are all connected to a common standby voltage, Vsb, which is chosen to maximize read-noise-margin while also safely maintaining bit cell data. During a memory block read, bit cell sub-column virtual ground lines are driven to Gnd at the same time, or somewhat before the word line is driven to a value 10% to 20% above logic 1 voltage, Vdd. BIT line voltages, which start at Vsb, are either pulled substantially lower, or slightly higher by activated bit cells, and sensed by sense amplifiers that connect to BIT lines. During a memory block write, one virtual ground voltage is preferentially driven to Gnd at the same time, or somewhat before word line RW is driven to a value 10% to 20% above Vdd. Also, BIT lines are driven to Gnd or to Vdd, according to data values which are to be transferred to selected bit cells, at or about the same time as RW is driven. A virtual ground voltage difference is used to enhance the write 1 cycle while maintaining adequate noise margin in write-disturbed cells. If several words are to be accessed in parallel from a single memory block row, all but 1 such word should be masked to prevent incorrect data from being written to said words. Standby and read-write control circuitry may be shared between adjacent memory columns to reduce control overhead.

DETAILED DESCRIPTION OF INVENTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Large memories are hierarchically constructed from smaller memory building blocks (MBB). Within the lowest level of such a block, BIT lines may run through a column that is further divided into sub-columns. For example, a column containing 128 bit cells may be sub-divided into 2 64-bit or 4 32-bit sub-columns. During primary decoding, only 1 bit cell of a column is accessed at a time. Multiple columns are arranged in an array to form rows and columns. A row of bit cells may contain 1 or more words of bits, where a word is the smallest number of bits that are input to, or output from the memory. If a row contains more than 1 word of bits, all but 1 word must be masked during a write so only one selected word is changed. If a row contains more than 1 word of bits, secondary decoding, or column decoding is used to select the correct word for input/output.

A large memory will have a large number of MBB's. For example, a 64 Mb memory may be composed of 256×256 Kb MBB's, or 1024×64 Kb MBB's, or 4096×16 Kb MBB's. At the lowest level, a 16 Kb MBB may have, for example, 128 rows and 8×16-bit words for columns. Those skilled in the art will also be able to choose other MBB sizes.

Figure 6:
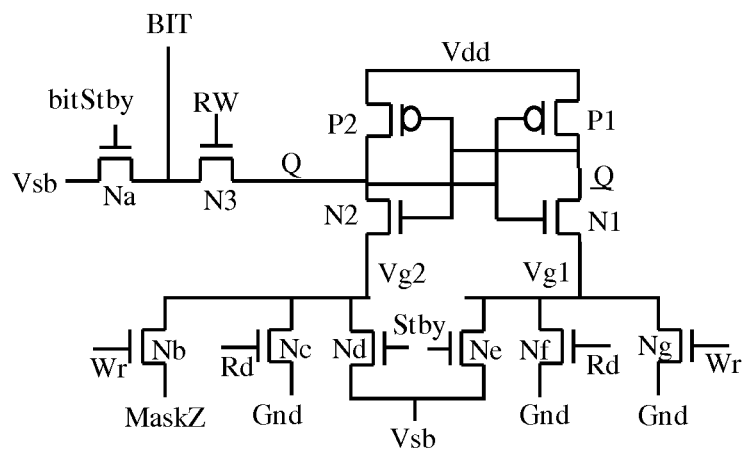
FIG. 6 is a circuit diagram depicting a 5 T SRAM bit cell having read-write and standby control circuitry for the present invention.
Figure 7:
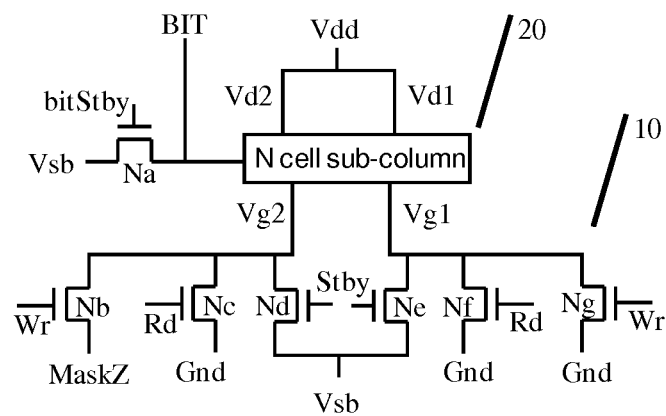
FIG. 7 is a circuit diagram depicting a sub-column of 5 T bit cells having read-write and standby control circuitry for the present invention.

FIG. 6 shows how standby and virtual ground read-write control circuitry is added to a single 5 T bit cell in the present invention. In the preferred embodiment, N bit cells with common Vg1 line, and common Vg2 line are connected to one set of control circuitry, 10, as shown in FIG. 7. The number of cells in a sub-column may, for example, be 32 or 64 when the column has 128 bit cells (rows). Vdd is the chosen logic 1 voltage for the CMOS implementation technology, which might be 1.2V in a 65 nm CMOS process. Both inverters 1 and 2 of FIG. 6 have their Vd1, Vd2 signals tied to Vdd. Inverters 1 and 2 have separate virtual ground lines Vg1, and Vg2. The tall-thin bit cell layout format can accommodate separate virtual ground lines, especially for a 5 T bit cell where there is no BIT line (Proc. 2009 Conf. on Computer Design, pp 10-16).

Standby voltage, Vsb, is chosen such that (Vdd-Vsb) is greater than the bit cell data retention limit including a guard voltage, and such that the RNM for the FS process case is favored. There are several techniques available for generating Vsb, as in U.S. Pat. No. 7,684,262; Proc. Midwest Symposium on Circuits and Systems, MWSCAS 2010, pp 121-123; and IEEE JSSC, Vol. 42, No. 1, January 2007, pp 233-242. For example, the value of Vsb in a 65 nm CMOS process might be 0.52V for the FS corner when Vdd is 1.2V. A flexible tolerance of about +/−30 mV is within the capability of voltage control circuits and sense amplifiers. Vsb may be fine tuned to accommodate manufacturing process and temperature variations.

Figure 9:
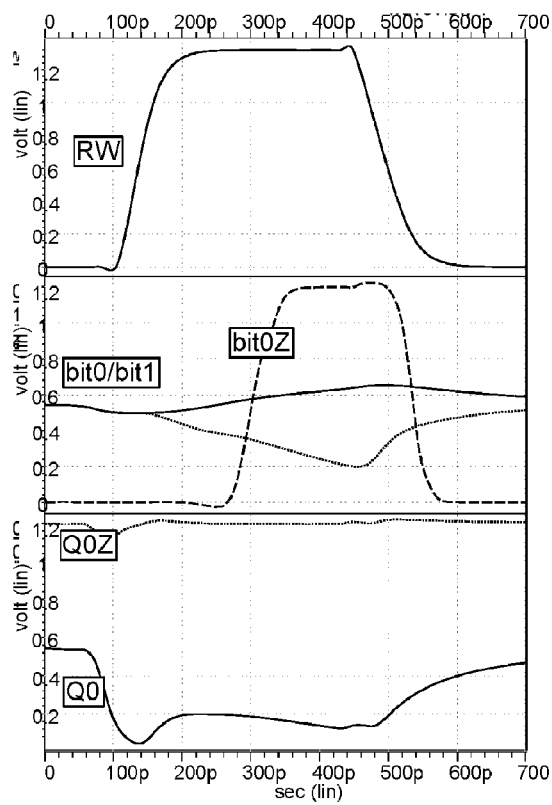
FIG. 9 shows timing waveforms for typical bit cell read 0 and read 1 operations.

To perform a read operation, selected bitStby and virtual ground Stby signals of FIGS. 6,7 are driven to Gnd while the selected Rd signal is driven to Vdd, thereby causing signals Vg1, Vg2 to be driven to Gnd so the bit cell remains stable during a read cycle. This should happen slightly before selected word line RW is driven to voltage $V_{RW}$, where $V_{RW}$ is 10% to 20% higher than Vdd. Prior art designs generally do not drive word lines above Vdd during a read, as it reduces cell stability. However, the asymmetry of a 5 T bit cell plus the use of higher thresholds helps to maintain read-noise-margin. A higher $V_{RW}$ voltage also helps to improve read performance. The BIT line, which is close to Vsb initially, is connected to the selected bit cell's Q value when RW is activated. If Q is at a logic 1 state, the BIT line is pulled weakly above Vsb via transistors N3 and P2 in FIG. 6. If Q is at a logic 0 state, the BIT line is pulled down through transistors N3, N2, and Nc, in FIGS. 6,7. Because pulling up is slower than pulling down, the BIT sense circuit (not shown) should have its trip point below Vsb. After a short delay from the rise of RW, the sense circuit may be activated. As is commonly practiced, the RW signal may be a pulse of sufficient duration to permit sensing to complete. A return to the standby state may also then be initiated. FIG. 9 shows typical waveforms for a read operation involving two different BIT lines, bit0 and bit1. Bit0 is pulled low by bit cell value Q0, while bit1 is pulled high by bit cell Q1. The Q0 waveform initially follows Vg2 down from Vsb and thereafter shows minimal disturbance during the read. Q1 (not shown) is similarly unaffected. BIT lines bit0/bit1 show a small capacitive coupling to Vg2 (initial small drop), which must be taken into account by those skilled in the art. Signal bit0Z is the output from a non-latching single-bit sense amplifier (not shown in the FIGs.).

Figure 8:
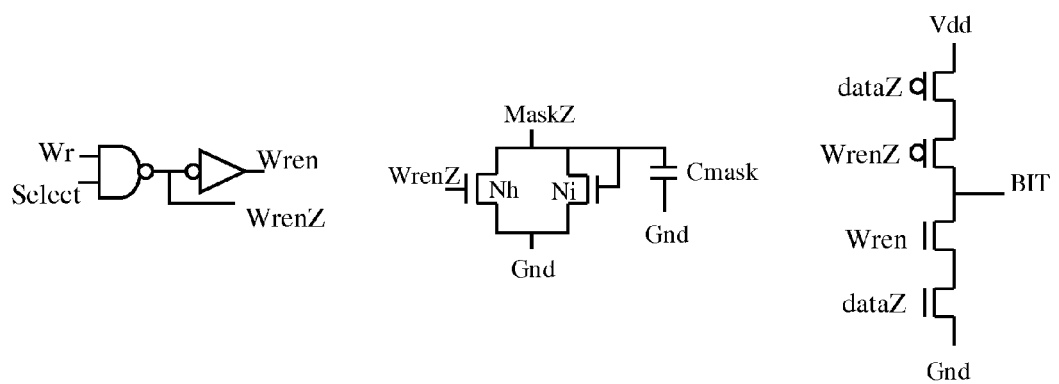
FIG. 8 shows circuit schematic diagrams for an active low write mask signal, and a BIT line driver.
Figure 10:
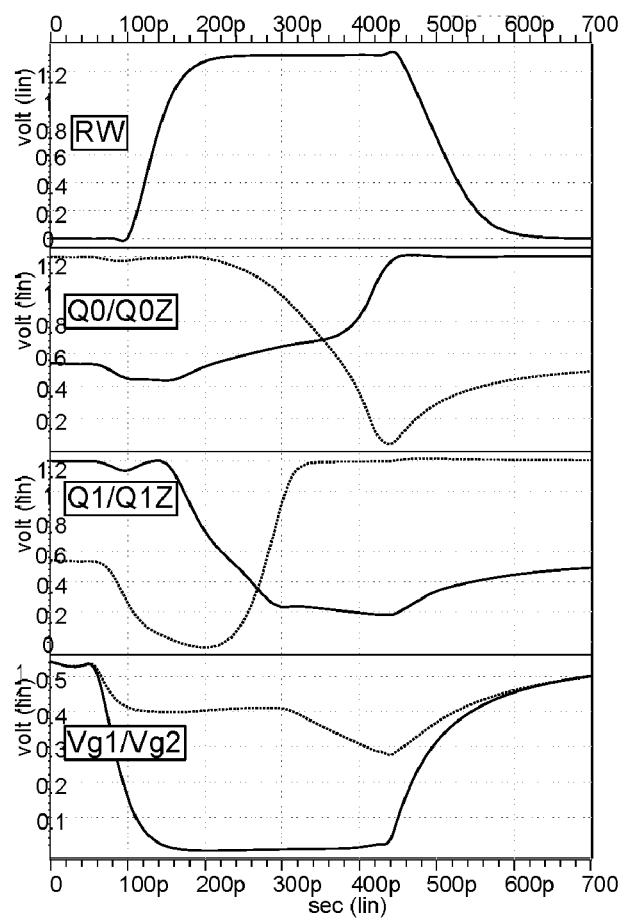
FIG. 10 shows timing waveforms for typical bit cell write 0 and write 1 operations.
Figure 11:
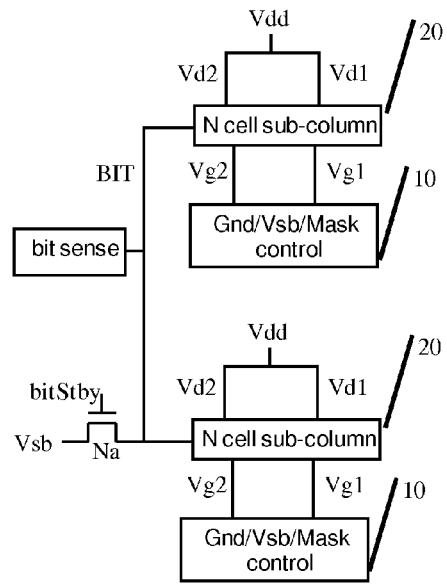
FIG. 11 is a block diagram showing multiple sub-columns with a common BIT line.

To perform a write operation, selected bitStby and Stby signals of FIGS. 6,7 are driven to Gnd while selected signal Wr is driven to Vdd, thereby causing virtual ground Vg1 to be driven to Gnd, while the behavior of virtual ground Vg2 is determined by signal MaskZ. This may happen before or at the same time as selected word line RW is driven to voltage $V_{RW}$. Driving RW above Vdd is desirable to compensate for transistor N3's high $V_t$ value, plus a possible process skew contribution. If the write operation is not masked (disabled), signal MaskZ will be initially floating at Gnd level, but due to charge equalization will rise to a voltage, Vm (also causing Vg2 to drop to Vm), that is determined by the relative capacitances of signals MaskZ and Vg2. Furthermore, the rise to voltage Vm of MaskZ is partly limited by diode connected transistor Ni of FIG. 8, where transistor Ni has a low threshold voltage. This limits the write-disturb of non accessed bit cells in the sub-column that is attached to Vg2, particularly in the fast NMOS process corner. Data to be written into the selected bit cell may be applied to the BIT line (FIG. 8), which may run through all of the sub-columns, as shown in FIG. 11. If the write operation is masked, signal MaskZ is held at Gnd via transistor Nh and the BIT line driver remains off, thereby converting a write operation into a read operation (without sensing). FIG. 10 shows typical waveforms for writing to two different bit cells, Q0, Q1. The state of bit cell Q1 is changed from 1 to 0, while the state of bit cell Q0 is changed from 0 to 1. It can be seen that the write 0 event is slightly faster than the write 1 event. Virtual ground line Vg1 is driven to Gnd while Vg2 drops initially to Vm due to the MaskZ circuit in FIG. 8. Vg2 may drop again due to an adjacent write 0 event.

Figure 1:
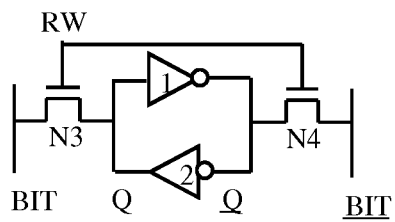
FIG. 1 is a circuit schematic diagram of a prior art 6 T SRAM bit cell.
Figure 2:
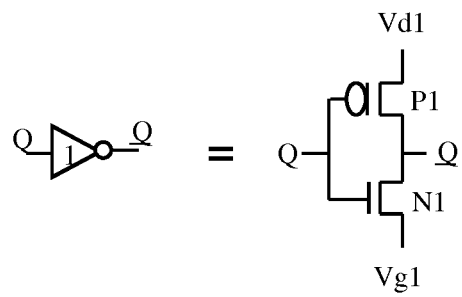
FIG. 2 shows more detail of a FIG. 1 inverter sub-circuit.
Figure 3:
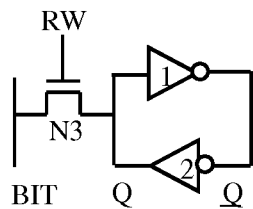
FIG. 3 is a circuit schematic diagram of a prior art 5 T SRAM bit cell.
Figure 4:
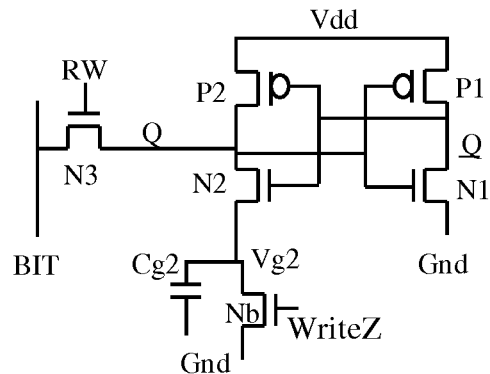
FIG. 4 is a circuit schematic of a second prior art 5 T SRAM bit cell.
Figure 5:
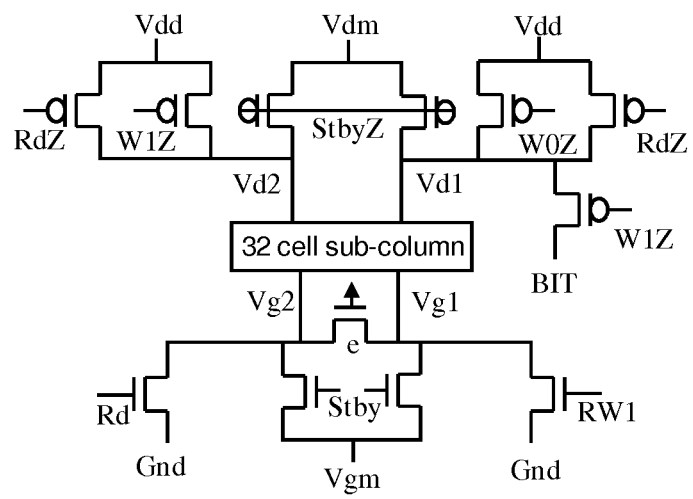
FIG. 5 is a schematic depicting prior art control circuitry for a sub-column of 5 T SRAM bit cells.

In prior art 6 T bit cells, the widths of transistors N1, N2 in FIG. 1 are usually the same, and they are usually 30%, or more, greater than the widths of transistors N3, N4, which are also usually the same. This is to protect the cell during a read operation, where either Q or $\bar{Q}$ may be disturbed by BIT or $\overline{BIT}$. In the present invention, transistors N3 and N2 of FIG. 6 may be substantially the same size, while transistor N1 may be minimum size. This is partly because the 5 T bit cell is asymmetrical, and partly because all transistors have a high $V_t$, for example, 0.55 to 0.60V when Vdd is 1.2V. Transistors P1, P2 may be minimum size. In contrast, Carlson et al report prior art 5 T cells with width N3>> width N2, width N1 greater than minimum, and width P2 greater than minimum, thereby not achieving maximum reduction in area or standby power over a prior art 6 T bit cell.

Figure 12:
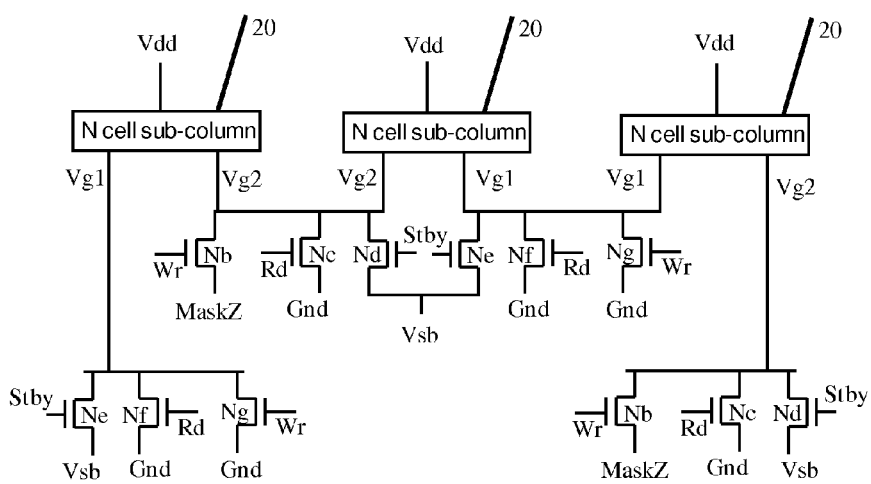
FIG. 12 is a block diagram showing pairs of adjacent sub-columns sharing read-write and standby control circuitry for Vg1 and Vg2 virtual ground lines.

The layout efficiency of the present invention is partly determined by how Vg1, Vg2 control circuitry is applied to rows and columns of bit cells. FIG. 11 shows how control circuits, 10, may be applied to multiple sub-columns, 20, as partly taught in U.S. Pat. No. 7,372,721. Each sub-column subdivision adds more control overhead. The benefit is a savings in power due to reduced load and shorter Vg1, Vg2 lines. A further benefit of the present invention is shown in FIG. 12. It is normal in the art to have multiple columns of cells placed adjacent to each other to form rows of bit cells. Because the bit cells are mirrored and otherwise oriented to fit together, adjacent sub-columns, 20, will have Vg1 and Vg2 connections and wires that are close together. Subject to a simple write constraint, pairs of Vg1, Vg2 connections may share a single wire as shown in FIG. 12, thereby reducing control overhead by nearly a factor of 2. The write constraint is that two adjacent sub-columns which share a Vg2 wire will both be masked or written to at the same time. During a read, two adjacent sub-columns may pass current through the same Nc transistor, so its size may be increased to maintain performance. Vg1 signal behavior is similar during read and write. It may also be observed, that pairs of transistors Nb, Nc, and Nf, Ng in FIG. 12 are used in a very similar manner. Transistors Nf, Ng could easily be replaced by a single transistor which is driven during "read or write". Similarly transistors Nb, Nc could be replaced by a single transistor which is driven during "read or write". In the latter case, MaskZ must be driven strongly to Gnd during a read to maintain performance. If only 1 set of transistors is combined, e.g. Nf, Ng, an additional control wire must be driven during both read and write events. Thus, further overhead reduction is possible.

As will be apparent to those skilled in the art in the light of the foregoing disclosure, many alterations and modifications are possible in the practice of this invention without departing from the spirit or scope thereof. For example, voltages $V_{RW}$ and Vdd could be reduced a small amount, provided that $V_{RW}$ remains 10%-20% larger than Vdd, and appropriate bit cell noise margins are maintained. As another example, the BIT line could be sub-divided along with sub-columns, having a separate sense circuit in each sub-column. As a further example, virtual ground Vg1 could be driven to a small negative voltage during a write provided that virtual ground Vg2 Vm value is correspondingly reduced to maintain appropriate bit cell noise margins. The scope of the invention is to be construed in accordance with the substance defined by the following claims.

What is claimed is:

1. A Static Random Access Memory (SRAM) incorporating a plurality of five transistor (5 T) memory bit cells, each comprising:
   first inverter connected between a fixed supply voltage and a first virtual ground voltage, wherein first inverter gate has a first storage node Q as input and a second storage node/Q as output;
   a second inverter, cross-coupled with the first inverter, connected between said fixed supply voltage and a second virtual ground voltage, wherein second inverter gate has the second storage node/Q as input and the first storage node Q as output;
   a BIT line;
   a pass transistor for selectively connecting said BIT line to the first storage node;
   standby switches for selectively connecting said BIT line and said first and second virtual ground lines to a common standby voltage when the bit cell is not selected; and
   control switches for selectively connecting said first and second virtual ground lines to voltages other than the standby voltage when the bit cell is selected for one of reading, writing, or write masking operations.

2. The SRAM as defined in claim 1, wherein each bit cell further comprises:
   the pull-down transistors of first and second inverters, the pass transistor, the standby switches, and the control switches are NMOS transistors; and
   the pull-up transistors of first and second inverters are PMOS transistors.

3. The SRAM as defined in claim 2, wherein each bit cell further comprises a BIT line standby activation signal applied to one of the standby switches independently from first and second virtual ground standby activation signals applied to the others of the standby switches.

4. The SRAM as defined in claim 2, wherein the control switches comprising a first set of control switches for driving first and second virtual ground lines to system ground during a read operation.

5. The SRAM as defined in claim 2, wherein the control switches comprising a second set of control switches for driving first virtual ground line to system ground, and second virtual ground line to a second voltage input, during a write operation.

6. The SRAM as defined in claim 5, wherein the second voltage input is capacitively charged to a voltage that is less than the standby voltage during a write operation, thereby reducing the voltage on said second virtual ground line.

7. The SRAM as defined in claim 6, wherein the second voltage input rising is limited by an NMOS transistor connected as a diode.

8. The SRAM as defined in claim 5, wherein the second voltage input is driven to system ground to help abort or mask a write operation.

9. A method of writing a binary digit value asserted on a BIT line into a 5 T memory bit cell, the bit cell comprising first and second inverters cross-coupled to define first and second storage nodes, a pass transistor coupled between said BIT line and said first storage node, said pass transistor further coupled to a read-write enable line for controllably switching said pass transistor on or off, and a BIT line standby switch coupled between said BIT line and a standby voltage, wherein said first and second inverters are connected to a common supply voltage, and to first and second virtual ground lines, respectively, said first and second virtual ground lines further connected to standby and read-write control switches, the method comprising:
   turning off said BIT line standby switch and standby control switches coupled to first and second virtual ground lines;
   driving said selected BIT line to the common supply voltage if the binary digit is logic 1, and to system ground if the binary digit is logic 0;
   driving said selected first virtual ground line to system ground while connecting said second virtual ground to a second signal which will charge up to a voltage that is less than the standby voltage; and
   driving said read-write enable line to a voltage that is higher than the common supply voltage for a pre-determined amount of time while said bit cell is written with binary digit value.

* * * * *